United States Patent [19]

Yamada et al.

[11] Patent Number: 4,748,494

[45] Date of Patent: May 31, 1988

[54] LEAD ARRANGEMENT FOR REDUCING VOLTAGE VARIATION

[75] Inventors: Toshio Yamada, Kokubunji, Japan; Hiroyuki Itho, Charlottesville, Va.; Masayoshi Yagyu, Kokubunji; Akira Masaki, Musashino, both of Japan

[73] Assignee: Hitachi, Ltd., Tokyo, Japan

[21] Appl. No.: 853,929

[22] Filed: Apr. 21, 1986

[30] Foreign Application Priority Data

Apr. 19, 1985 [JP] Japan .................... 60-82357

[51] Int. Cl.⁴ .................. H01L 29/52; H01L 27/10
[52] U.S. Cl. ........................ 357/68; 357/71; 357/45
[58] Field of Search ............. 357/45, 65, 68, 71

[56] References Cited

U.S. PATENT DOCUMENTS

| | | | |
|---|---|---|---|
| T100,501 | 4/1981 | Balyoz et al. | 357/45 |
| 3,808,475 | 4/1974 | Buelow et al. | 357/68 |
| 4,475,119 | 10/1984 | Kuo et al. | 357/68 |
| 4,499,484 | 2/1985 | Tanizawa et al. | 357/68 |
| 4,583,111 | 4/1986 | Early | 357/68 |

*Primary Examiner*—Andrew J. James
*Assistant Examiner*—John Lamont
*Attorney, Agent, or Firm*—Antonelli, Terry & Wands

[57] ABSTRACT

A semiconductor device includes a plurality of circuit groups constituting an integrated circuit and each constituted by a plurality of circuit blocks and a bias circuit which applies a bias potential to said circuit blocks. The device further includes a plurality of power buses provided above the circuit groups through an insulating layer so as to feed power to circuit elements in the circuit groups. At least one of the power buses is constituted by a first bus for feeding power to the circuit groups and a plurality of second buses respectively provided for the circuit groups so that each second bus receives power from the first bus and feeds power to circuit elements in the corresponding circuit group. Each of the second buses is connected to the first bus at a predetermined position on the corresponding circuit group.

21 Claims, 12 Drawing Sheets

LEAD ARRANGEMENT FOR REDUCING VOLTAGE VARIATION

BACKGROUND OF THE INVENTION

The present invention relates to an integrated circuit and, more particularly, to a semiconductor device suitable for use in a large scale integration employed in, for example, a large-sized electronic computer, the semiconductor device comprising a substrate on which a multiplicity of circuit elements are formed, and power bus layers provided on the substrate for feeding power to the respective circuit elements.

Figure 14A:
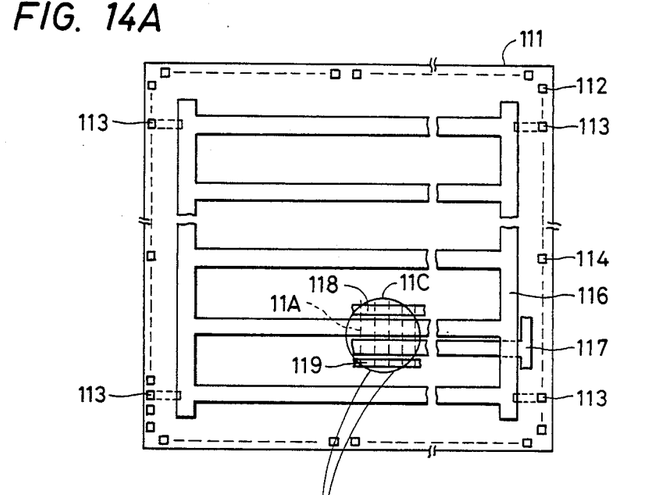
FIGS. 14A–14B shows a prior art power bus arrangement.

In conventional integrated circuits employed in, for example, electronic computers, power buses such as those shown in FIG. 14 are generally used for feeding power to the respective gates which are integrated into the circuits. In FIG. 14A, the reference numeral 111 denotes an LSI chip, while 112 represents bonding pads, and 116 to 119 denote power buses for feeding power to respective gates. The power bus 116 is connected to power pads 113. The other power buses are also connected respective pads, but this is not essential to the present invention, and description and illustration thereof are therefore omitted.

Figure 14B:
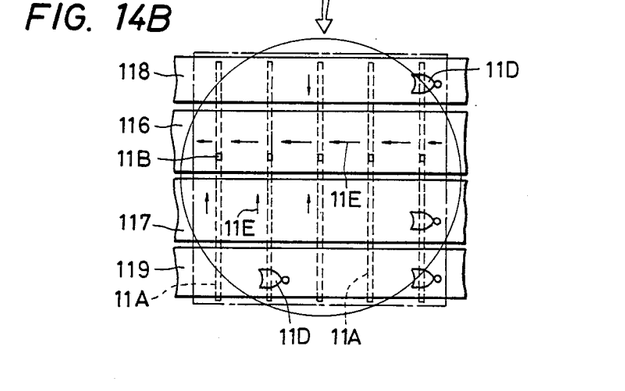

FIG. 14B is an enlarged view of a region 11C which is surrounded by the circle in FIG. 14A.

The power bus 116 is connected to power buses 11A in another layer through through-holes 11B, and power is fed to gates 11D from the power buses 11A, respectively.

Figure 15:
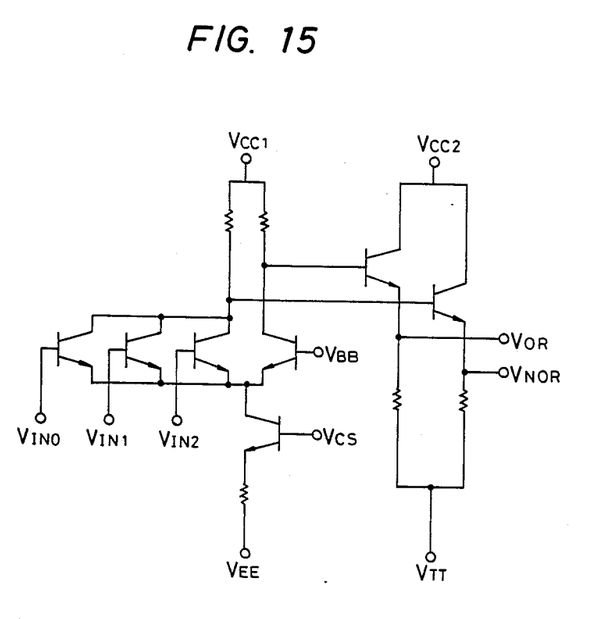
FIG. 15 is a circuit diagram of an ECL.
Figure 16:
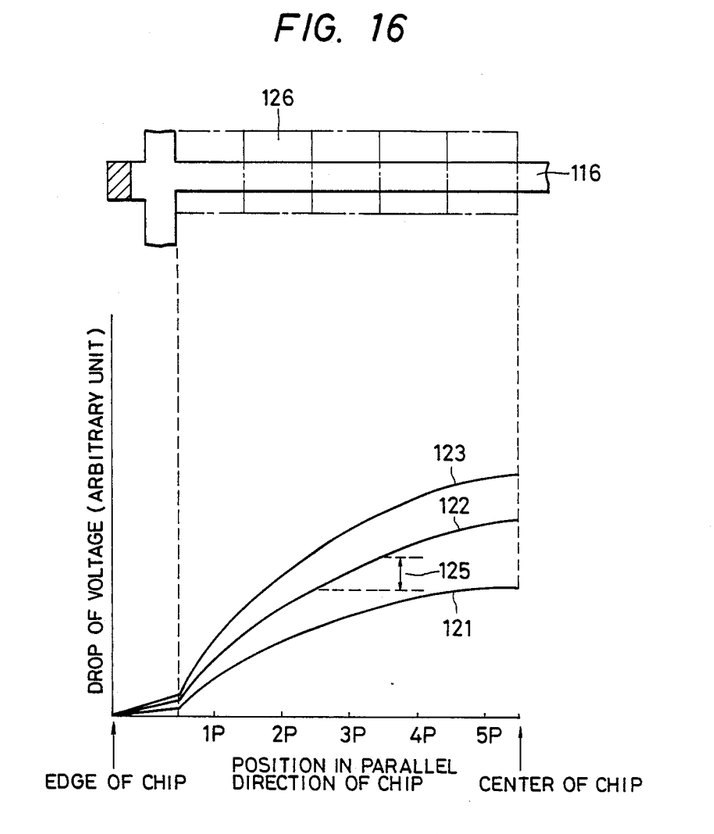
FIG. 16 is a graph showing the drop of voltage in the prior art.

As a gate, an emitter coupled logic (hereinafter referred to as an "ECL") such as that shown in FIG. 15 is widely employed in a high-speed LSI used in, for example, an electronic computer. The negative voltage source $V_{EE}$ of the ECL is fed with power through, for example, the power buses 116 and 11A shown in FIG. 14B. In this case, the current path is formed as indicated by the arrows 11E. FIG. 16 shows the drop of voltage in the current path. The axis of the abscissa of the graph shown in FIG. 16 represents the gate position in a direction of X (a direction parallel with the power bus 116 shown in FIG. 14), and the axis of the ordinate represents the drop of voltage. The section 126 surrounded by the one-dot chain line represents one of the circuit groups. The numeral 116 expresses a bus for the negative voltage source $V_{EE}$. The curves 121 to 123 show changes in the voltage drop occurring when the current supplied to each of the gates is increased.

LSIs generally have one or a plurality of bias circuits for the purpose of compensating for possible fluctuations in the supply voltage fed thereto. When it is necessary to compensate for possible variations in the supply voltage within the chip, each gate may have a bias circuit. However, if each gate is provided with a bias circuit, the layout square measure for each gate increases, and the power consumption also increases. One of the techniques to overcome this problem is an LSI arranging method which is mentioned in the specification of Japanese Patent Laid-Open No. 204624/1983. In this method, all of the gates are divided into a plurality of gate groups, and a bias circuit is provided for each gate group so as to compensate for possible variations in the supply voltage for a plurality of gates. Thus, the potential variations within each gate group are reduced as compared with the potential variations in the entire chip, so that this arrangement can be used within a range within which the degree of variations is so low that they can be ignored. However, as will be clear from the graph shown in FIG. 16, the supply voltage variations within each gate group 126 tend to increase, for example, as shown by the reference numeral 125, as the scale of integration of the LSI is enlarged or the circuit current is increased. To reduce such a drop of voltage, it is necessary to decrease the ratio of the number of gates in each gate group 126 to the number of bias circuits. This, however, involves the problem that the degree of integration of the LSI as a whole is lowered and the power consumption is increased.

SUMMARY OF THE INVENTION

In view of the above-described circumstances, it is a primary object of the present invention to provide a semiconductor device so designed that it is possible to satisfactorily reduce variations in the supply voltage within each of the circuit groups.

To this end, the present invention provides a semiconductor device in which a power bus for feeding power to circuit groups and a power bus for feeding power to each of the circuit elements in each circuit group are separated from each other, and these power buses are connected together at a predetermined position (including its vicinities) in the circuit group, whereby it is possible to satisfactorily reduce variations in the supply voltage within each circuit group. In addition, it is possible to further reduce the supply voltage variations equivalently by dividing each circuit group into a plurality of circuit blocks and providing an extremely simple buffer circuit for each circuit block.

DESCRIPTION OF THE PREFERRED EMBODIMENTS

Figure 1A:
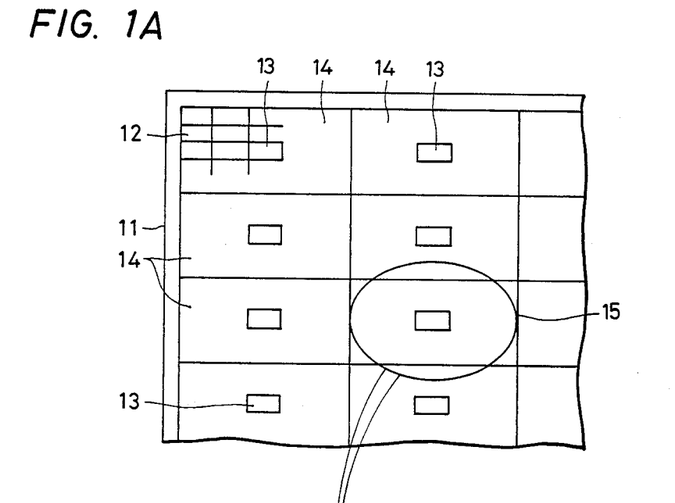
FIGS. 1A and 1B schematically show in combination one embodiment of the present invention.
Figure 1B:
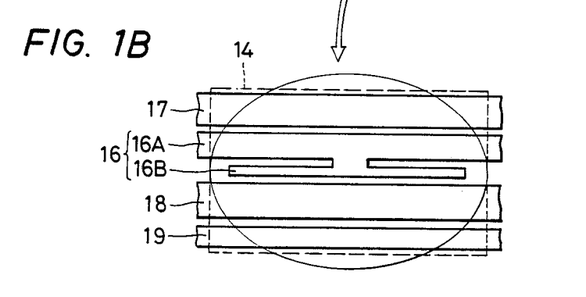

One embodiment of the present invention will be described hereinunder with reference to FIG. 1. FIG. 1A is a schematic plan view of an LSI chip in accordance with one embodiment of the present invention, which schematically shows a multiplicity of circuit groups formed on a substrate (not shown). In FIG. 1, the reference numeral 11 denotes an LSI chip, and the numeral 14 represents each of a plurality of circuit groups arranged in a matrix, the circuit groups being formed by dividing a multiplicity of circuit elements formed on the substrate. Each of the circuit groups comprises a bias circuit 13 disposed at or near the center of the group and a plurality of gate blocks 12 (a set of one or a plurality of gates) disposed around the bias circuit 13. FIG. 1B is an enlarged view of a region 15 surrounded by the ellipse in FIG. 1A, which shows power buses 16 to 19 alone. These power buses 16 to 19 are provided on the substrate through insulating layers, the substrate having a multiplicity of circuit groups 14 formed thereon. One of the circuit groups 14 is indicated by the chain line in FIG. 1B. In this embodiment, the power bus 16 among the power buses 16 to 19 is constituted by a power bus 16A for feeding power to the circuit groups 14 located below the power bus 16A and a plurality of power buses 16B respectively provided for the circuit groups 14 for each feeding power to circuit elements in the corresponding circuit group 14. The power buses 16A and 16B are connected together at or near the center of the circuit group 14, and this enables supply voltage variations to be effectively reduced. However, it is not always necessary to connect them at or near the center of the circuit group 14. In this embodiment, among the power buses 16 to 19, the power bus 16 alone is constituted by separate buses, that is, the bus 16A for feeding power to the circuit groups 14 and the buses 16B for each feeding power to circuit elements in the corresponding circuit group 14. It is, however, possible to constituted the other power buses 17 to 19 in a similar manner, according to need. It is preferably to apply the present invention to a power bus which particularly has the problem of supply voltage variations. Further, although in this embodiment the power buses 16A and 16B are connected at a single position, they may be connected at a plurality of positions to accomplish the object of the present invention, provided that the connecting positions are close to each other. In the prior art shown in FIG. 14, the connecting positions are apart from each other within each circuit group, and this results in large variations in the supply voltage. Advantageous effects offered by this embodiment will be explained with reference to FIG. 2 which is a plan view of an LSI chip and the graph shown in FIG. 5.

Figure 2A:
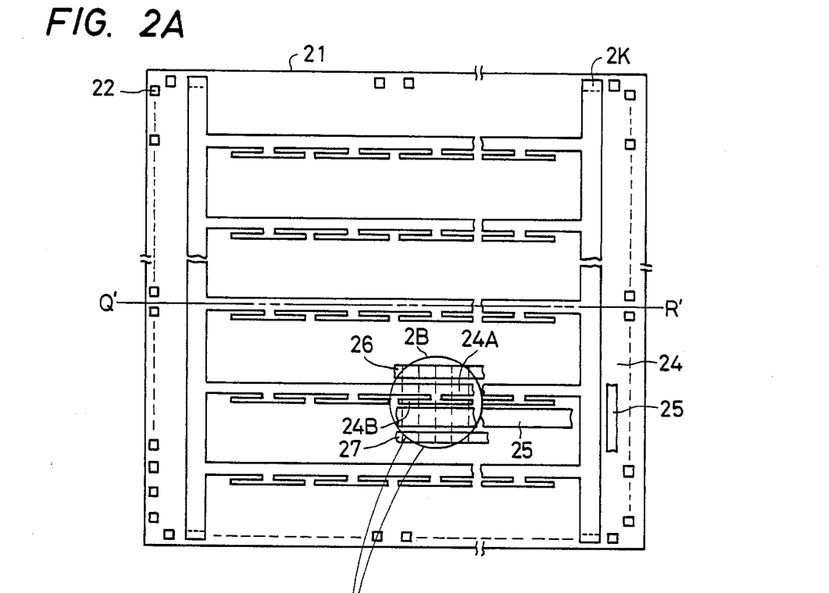
FIGS. 2A–2B illustrates the embodiment shown in FIG. 1, which corresponds to FIG. 14 showing a prior art.

FIG. 2 shows the embodiment of the present invention in such a manner that the arrangement thereof corresponds to that of the prior art shown in FIG. 14 for facilitating understanding, In FIG. 2, the reference numeral 21 denotes an LSI chip, while 22 represents bonding pads, and 24 to 27 respectively denote power buses. The power buses 24, 25, 26 and 27 respectively correspond to the power buses 16, 18, 17 and 19 shown in FIG. 1. The power bus 24 is connected to a power pad 2K. Although the other power buses 25, 26 and 27 are respectively connected to other power pads, this is not essential to the present invention, and description and illustration thereof are therefore omitted. The power buses 25, 26 and 27 are also employed for feeding power or other purposes. The power buses 24, 25, 26 and 27 feed the respective circuit groups with powers differing in level. The power buses 24, 25, 26 and 27 are provided through insulating layers on a substrate having a multiplicity of circuit groups (denoted by the reference numeral 14 in FIG. 1, the circuit groups being arranged in a matrix on the substrate in this embodiment, and each circuit group being constituted by a bias circuit and a plurality of gate blocks) formed thereon. The power buses 26, 24, 25 and 27 are arranged in the mentioned order on the LSI chip substrate in parallel to each other in one direction (in the lateral direction in this embodiment) and at predetermined regular spacings. A plurality of power buses which constitute each of the buses 24 to 27 are connected together at both edges of the substrate by power buses which extend in a direction perpendicular to the buses 24 to 27 (FIG. 2A shows the connecting power buses corresponding to the power buses 24 and only a part of one connecting power bus corresponding to the power buses 25), and the connecting power buses are respectively connected to power pads. As a material for these power buses, an electrical conductor such as Al or Cu may be employed. In this embodiment, the four power buses 24 to 27 are respectively positioned above the corresponding circuit groups. In this embodiment, the power bus 24 among the four power buses is constituted by a bus 24A extending in the lateral direction of the chip substrate for feeding power to the circuit groups, and a plurality of buses 24B respectively provided for the circuit groups so that each bus 24B feeds power to circuits elements in the corresponding circuit group. The buses 24B extend in parallel with the bus 24A and are each connected to the latter at or near the center of the corresponding circuit group.

Figure 2B:
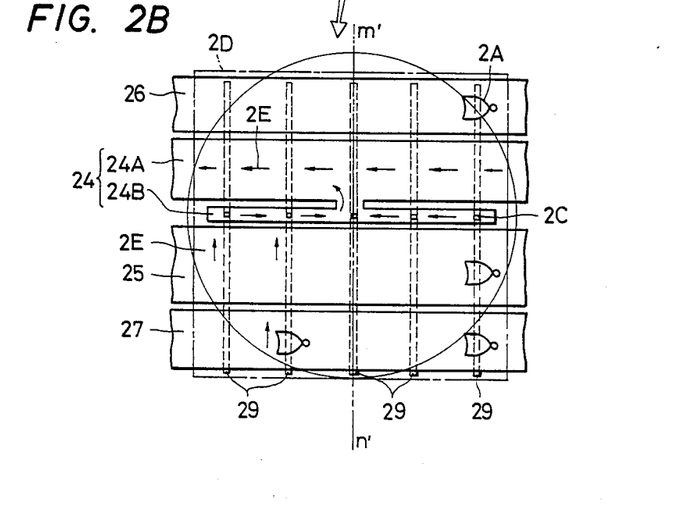
Figure 3:
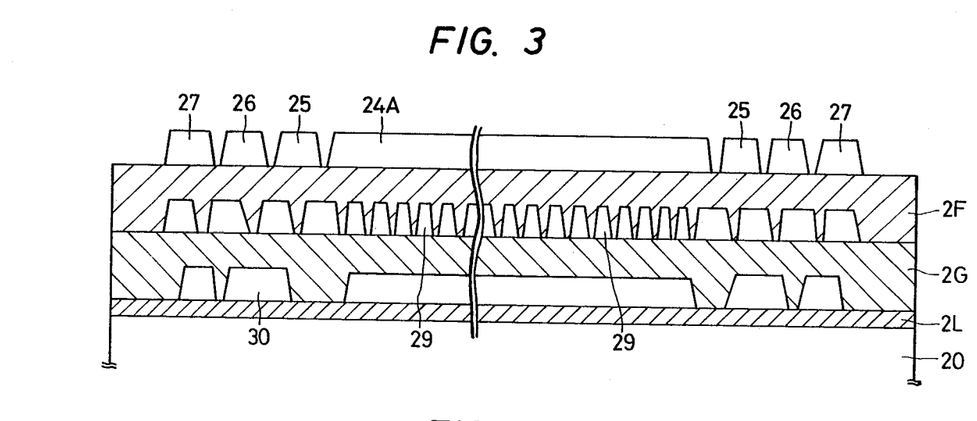
FIG. 3 shows one example of the cross-section of the embodiment shown in FIG. 2A.
Figure 4:
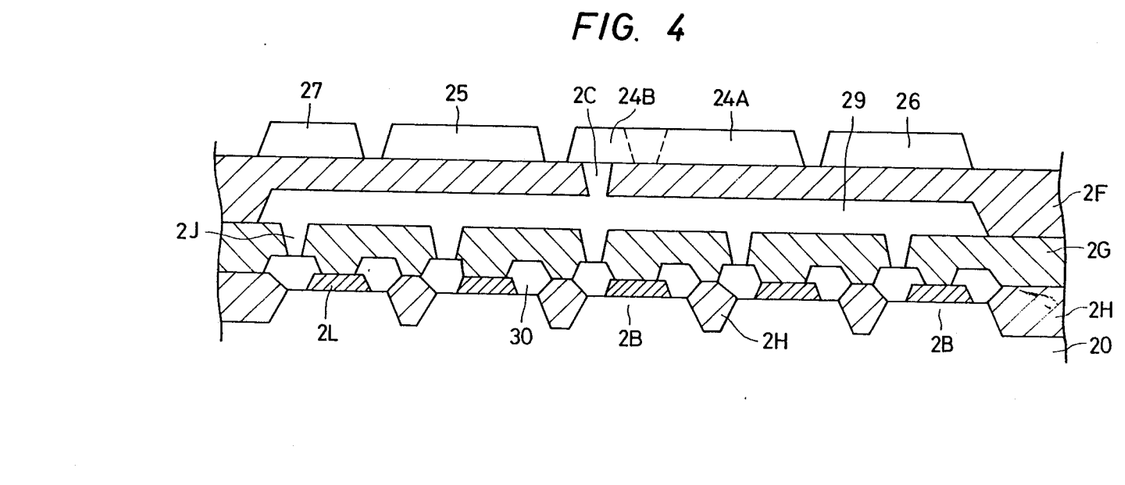
FIG. 4 shows one example of the cross-section of the embodiment shown in FIG. 2B.

FIG. 3 is a sectional view taken along the line Q'-R' in FIG. 2A. In FIG. 3, the reference numerals 24 to 27 respectively denote power buses, and the numeral 29 represents power buses in another layer. The numerals 2F, 2G and 2L respectively denote insulating layers. The numeral 20 denotes a semiconductor substrate, e.g., Si, and the numeral 30 denotes electrodes of circuit elements formed on the substrate 20 or signal buses connecting these circuit elements. FIG. 2B is an enlarged view of a region 2B' surrounded by the circle in FIG. 2A. FIG. 4 is a sectional view taken along the line m'-n' in FIG. 2B. As shown in FIG. 4, the power bus 24A is connected to each of the power buses 24B at a position corresponding to the center of the corresponding circuit group 2D (corresponding to the circuit group 14 in FIG. 1) and is further connected to a power bus 29 in another layer through a through-hole 2C and to a diffusion layer 2B of each of the circuits 2A formed on the substrate 20 through a through-hole 2J. The reference numerals 2F, 2G and 2L respectively denote insulating layers, and 2H denotes an insulator for isolating each pair of adjacent circuit elements formed on the substrate 20. A plurality of power buses 29 are provided below the power buses 24 to 27 through the insulating layer 2F so as to extend in a direction perpendicular to the power buses 24 to 27 at predetermined regular spacings. Some of the power buses 29 are connected to the bus 24B through through-holes 2C respectively provided at the intersections between the buses 24B and 29. The power buses 29 connected to the bus 24B are separated for each circuit group so as to serve to feed power to circuit elements in the circuit group concerned only. The remaining power buses 29 are also divided into groups each consisting of a plurality of buses 29 and are respectively connected to the power buses 25, 26 and 27 through through-holes provided at the intersections between the buses 29 and 25, 26, 27. It is however, not necessary to separate the power buses 29 connected to the power buses 25, 26 and 27 for each circuit group, and these buses 29 may be connected between the circuit groups in the longitudinal direction. In FIG. 2B, the buses 29 which are connected to the power bus 24B alone are shown by the broken line, and the buses 29 which are respectively connected to the power buses 25, 26 and 27 are not shown. These power buses 29 are provided on the substrate 20 through the insulating layer 2G and connected through the through-holes 2J to desired circuits among a multiplicity of circuits (gates) formed on the substrate 20.

Figure 5:
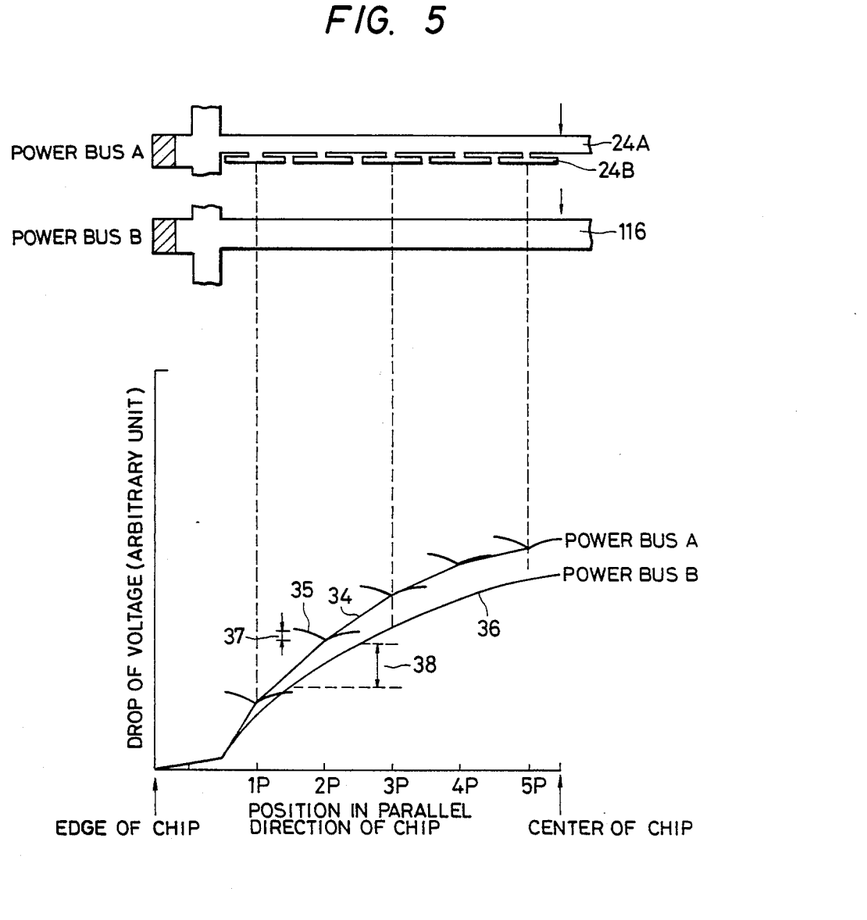
FIG. 5 is a graph showing advantageous effects offered by the present invention.

Taking an ECL as an example of each of the gates 2A shown in FIG. 2B, the power bus 24 serves as, e.g., a bus for feeding the negative voltage source $V_{EE}$ shown in FIG. 15. In addition, for instance, the power buses 25, 26 and 27 are employed for feeding voltage sources $V_{CC2}$ $V_{TT}$ and $V_{CC1}$ respectively. In this case, the current path is formed as shown by the arrows 2E in FIG. 2B. Thus, in the circuit group the current flows via the buses 29 and 24B and concentrates on the bus 24A at or near the center of the circuit group. FIG. 5 is a graph for comparison between the drop of voltage in the power bus 24 in accordance with the present invention shown in FIG. 2 and the drop of voltage in the power bus 116 in the conventional arrangement shown in FIG. 14. The axis of abscissa of the graph represents the position in parallel direction of the chip, and the axis of ordinate represents the drop of voltage. The reference numerals 1P to 5P on the axis of abscissa respectively denote the centers of circuit groups. The power bus A represents the arrangement of the power bus 24 in accordance with the present invention, and variations in the voltage drop in accordance with the power bus A are shown by the curves 34 and 35. More specifically, the curve 35 shows the voltage drop variations in each of the circuit groups. On the other hand, the power bus B represents the arrangement of the conventional power bus 116, and variations in the voltage drop in accordance with the power bus 116 are shown by the curve 36. In addition, the reference numerals 37 and 38 indicate variations in the voltage drop in one circuit group in the cases of the present invention and the prior art, respectively. As will be understood from the graph, the variations in the voltage drop in one circuit group in the case of the power bus A in accordance with the present invention are much smaller than those in the case of the power bus B in accordance with the prior art. The reason for this is as follows. Namely, the gradient of the curve 36 is smaller than that of the curve 34 since the power bus 116 can be made thicker than the power bus 24A. However, since the power buses 24B are provided in the present invention, the voltage drop variations within each circuit group are such as those shown by the characteristic curve 35.

As described above, it is possible, according to this embodiment, to greatly reduce potential variations within each of the circuit groups as compared with the conventional arrangement. Accordingly, if a bias circuit is provided for each circuit group, any potential variations among the circuit groups can be compensated for by the bias circuits, so that it is possible to increase the operation margin of the gates throughout the entire chip.

Figure 6:
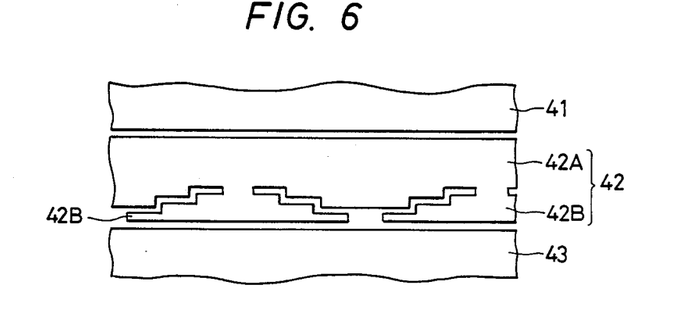
FIGS. 6 to 8 respectively show power buses in accordance with other embodiments of the present invention.

FIG. 6 shows one example of power buses in accordance with another embodiment of the present invention. The power buses 41, 42 and 43 shown in FIG. 6 respectively correspond to the power buses 26, 24 and 25 shown in FIG. 2. The power bus 42 is constituted by a plurality of buses 42B each of which is formed by stepwisely reducing the width of the power bus 24B shown in FIG. 2B toward the peripheral portions of the circuit group concerned, and a bus 42A which is formed by stepwisely increasing the width of the power bus 24A shown in FIG. 2B toward the peripheral portions of the circuit group inversely as the width of the bus 42B, the buses 42A and 42B being connected together at or near the center of the circuit group. Since the amount of current flowing through the power bus 24B shown in FIG. 2B becomes smaller toward the peripheral portions of the circuit group, potential variations within the circuit group can satisfactorily be minimized with the power buses 42B shown in FIG. 6. In addition, since the power bus 42A can be partially made larger than the power bus 24A shown in FIG. 2B, the voltage drop in the power bus 42 can be made smaller than that in the power bus 24 in accordance with the above-described embodiment.

According to this embodiment, therefore, it is possible to satisfactorily minimize the potential variations within each of the circuit groups and to reduce the potential variations throughout the entire chip. Accordingly, the operation margins of the bias circuits and the gates can be further widened.

Figure 7:
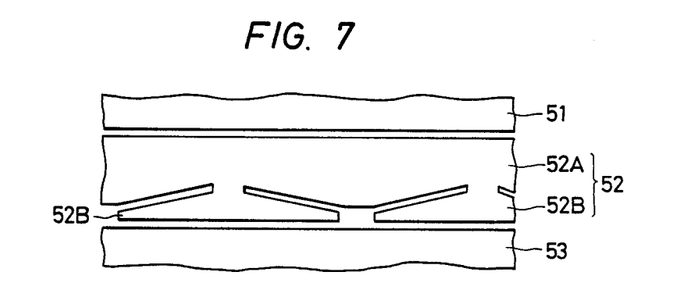

FIG. 7 shows a power bus 52 in accordance with still another embodiment. This power bus 52 also provides the same advantageous effects as those offered by the above-described power bus 42. Power buses 51, 52 and 53 shown in FIG. 7 respectively correspond to the power buses 26, 24 and 25 shown in FIG. 2. The power bus 52 is constituted by buses 52B each of which is gradually reduced in width toward the peripheral portions of the circuit group concerned, and a bus 52A which is gradually increased in width toward the peripheral portions of the circuit group inversely as the width of the bus 52B.

Figure 8:
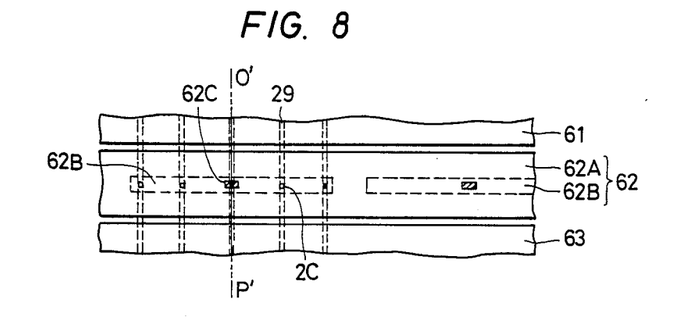

FIG. 8 shows one example of the power bus arrangement in accordance with a further embodiment of the present invention. Power buses 61, 62 and 63 shown in FIG. 8 respectively correspond to the power buses 26, 24 and 25 shown in FIG. 2.

Figure 9:
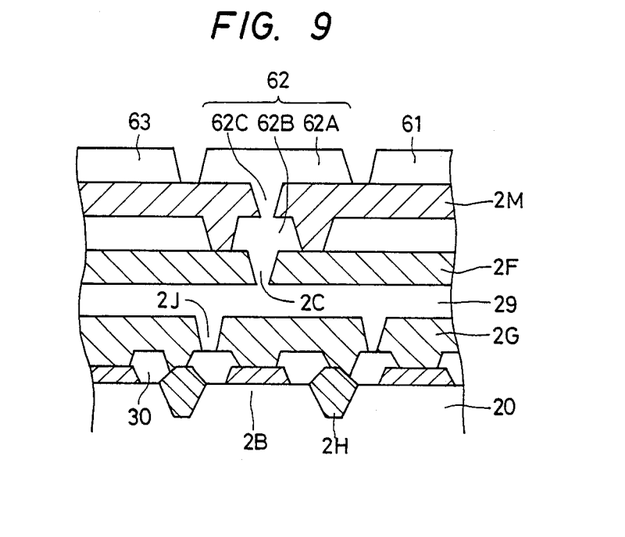
FIG. 9 shows one example of the cross-section of the embodiment illustrated in FIG. 8.

FIG. 9 is a sectional view raken along the line o'-p' in FIG. 8. A power bus 62A for feeding power to circuit groups is connected through through-holes 62C to power buses 62B in another layer each of which serves to feed power to circuit elements in each of the circuit groups, and is further connected through the through-holes 2C to the power buses 29 and through the through-holes 2J to the diffusion layers 2B of the circuits formed on the substrate 20. More specifically, the power buses 62B which are provided so as to respectively correspond to the circuit groups and each of which is adapted to feed power to circuit elements in the corresponding circuit group are disposed below the power bus 62A through an insulating layer 2M, and each power bus 62B is connected to the bus 62A at or near the center of the corresponding circuit group through the through-hole 62C. Accordingly, the feature of this embodiment resides in the fact that the power buses 62A and 62B are not in the same layer. This arrangement can also offer the above-described advantageous effects of the present invention.

Figure 10:
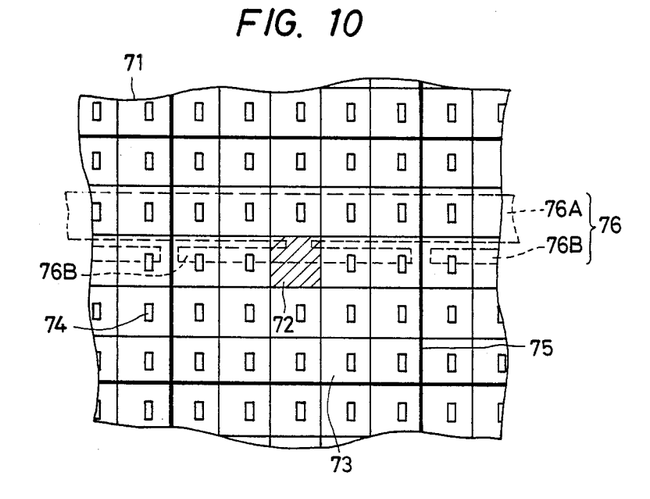
FIG. 10 shows a still further embodiment of the present invention.

FIG. 10 shows a still further embodiment of the present invention. FIG. 10 is a schematic plan view of circuits on an LSI chip. In this figure: the reference numeral 71 denotes a part of the circuit portion on the surface of the LSI chip; 72 a bias circuit (the hatched portion); 73 gate blocks; 75 one circuit group; and 76 a power bus in accordance with the present invention. The bias circuit 72, the gate blocks 73, the circuit group 75 and the power bus 76 shown in FIG. 10 respectively correspond to the bias circuit 13, the gate blocks 12, the circuit group 14 and the power bus 16 shown in FIG. 1. In FIG. 10, any power buses other than the bus 76 are not shown. The relationship between the power bus 76 and the circuit portion on the surface of the LSI chip is the same as that in the above-described embodiment, and description and illustration thereof is therefore omitted. This embodiment features that one buffer circuit 74 is provided for each gate block 73. The arrangement of the bias feed system in this embodiment will be explained with reference to FIGS. 11 and 12, and advantageous effects offered thereby will be described with reference to FIG. 13.

Figure 11:
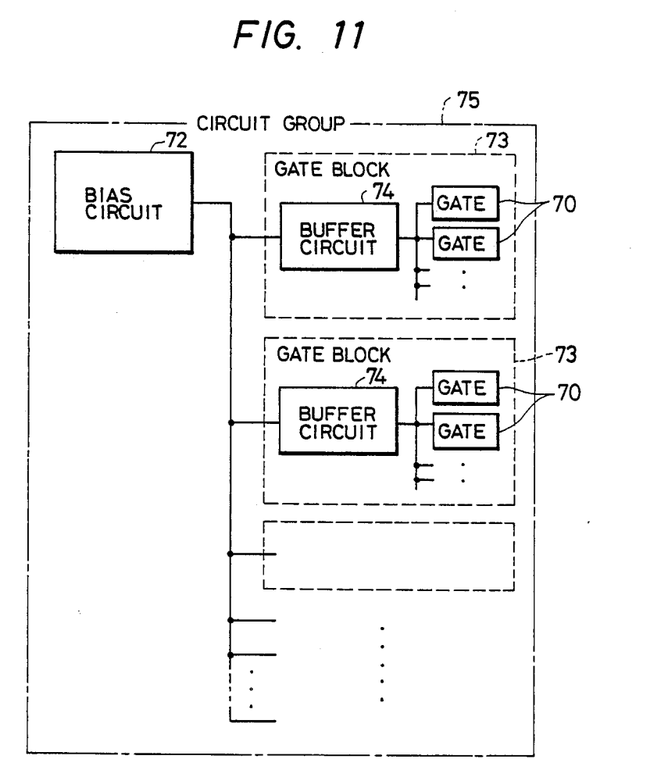
FIG. 11 schematically shows a bias feed system in accordance with the embodiment illustrated in FIG. 10.

Referring to FIG. 11 which is a block diagram of a bias feed system within one circuit group 75, the bias potential generated by the bias circuit 72 is input to the respective buffer circuits 74 within the gate blocks 73, and the output of each of the buffer circuits 74 is supplied to the gates 70 within the corresponding gate block 73. One practical example of the above-described arrangement will be explained below with reference to FIG. 12.

Figure 12:
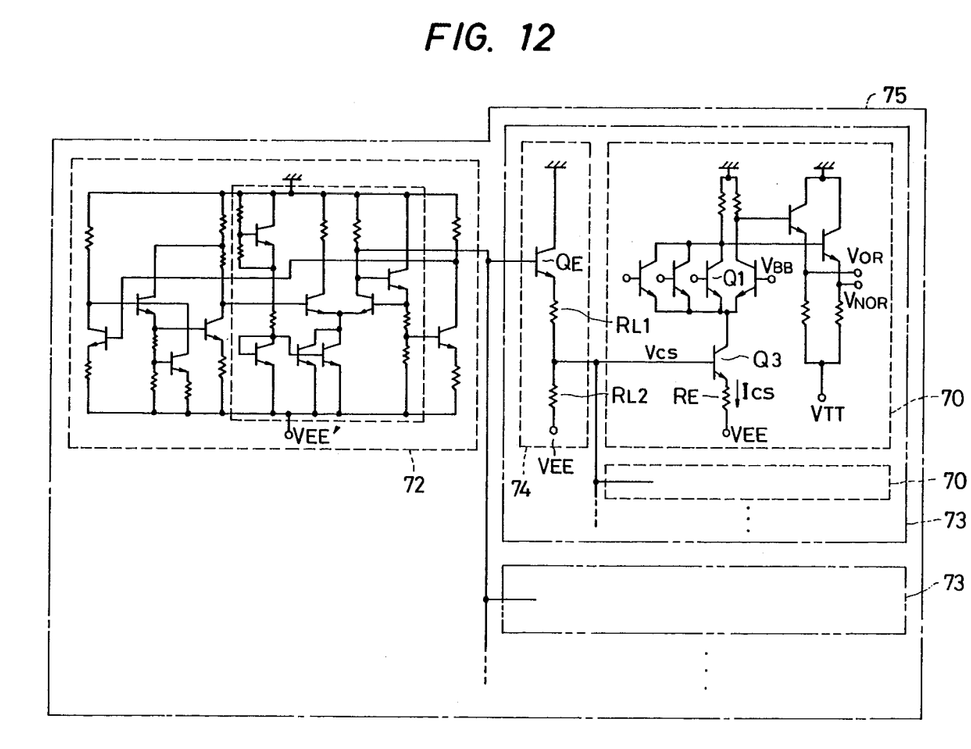
FIG. 12 shows in detail the arrangement illustrated in FIG. 11.

As the bias circuit 72, it is possible to employ one which is mentioned in the aforementioned specification of Japanese Patent Laid-Open No. 204624/1983, or a circuit which is formed by adding a voltage follower 90 to this bias circuit, as illustrated, for the purpose of improving the load characteristics. The principle of compensating for fluctuations in the supply voltage in this bias circuit 72 is not essential to the present invention, and description of the arrangement and operation of the bias circuit 72 is therefore omitted. Each of the buffer circuits 74 comprises a transistor $Q_E$ connected at the collector thereof to a positive voltage source (at the ground potential in this embodiment), and a voltage divider constituted by resistors $R_{L1}$ and $R_{L2}$ and connected at one end thereof to the emitter of the transistor $Q_E$ and at the other end thereof to the negative voltage source $V_{EE}$. A bias $V_{CS}$ for the constant-surrent source of the gates 70 is obtained from the junction between the resistors $R_{L1}$ and $R_{L2}$. Each of the gates 70 is a known ECL.

Figure 13:
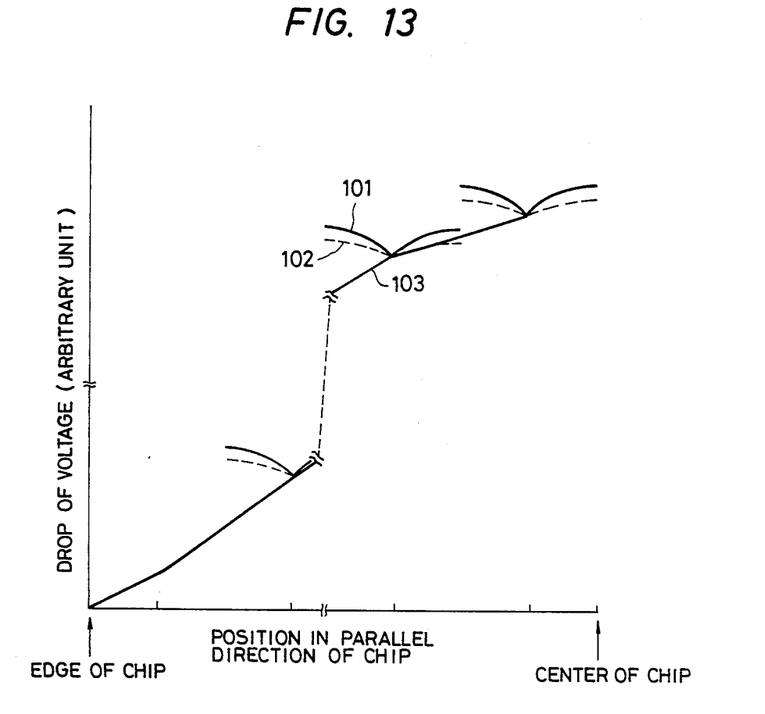
FIG. 13 is a graph showing advantageous effects offered by the embodiment illustrated in FIG. 10.

It is possible, according to this embodiment, to minimize current variations among the gates 70 due to the supply voltage drop within each of the circuit groups. As will be understood from FIG. 12, the supply voltage $V_{EE}$ of the gates 70 and the buffer circuit 74 is higher than the supply voltage $V_{EE}'$ of the bias circuit 72 by a drop $\Delta V_{EE}$ of the supply voltage within the circuit group. Although it is possible to minimize the drop $\Delta V_{EE}$ by virtue of the arrangement in accordance with the first embodiment of the present invention, it is not possible to eliminate the drop $\Delta V_{EE}$, i.e., to make it zero. However, this embodiment enables the drop $\Delta V_{EE}$ to be further minimized equivalently by virtue of the simple buffer circuit 74 (an emitter follower, in this embodiment) provided for each gate block. For instance, in the buffer circuit 74 the drop $\Delta V_{EE}$ is compressed into the product of the resistance ratio $R_{L1}/(R_{L1}+R_{L2})$ and the drop $\Delta V_{EE}$. Thus, the voltage drop within the circuit group is equivalently reduced, so that current variations among the gates 70 can be satisfactorily minimized. This advantageous effect is shown in FIG. 13. The axes of abscissa and ordinate in FIG. 13 are the same as those in FIG. 5, and the curve 103 is equal to the curve 34 shown in FIG. 5. However, the scale of the axes is enlarged in FIG. 13. The curve 101 represents voltage drop variations within each circuit group in which no buffer circuit 74 is provided in the gate blocks, while the curve 102 equivalently represents voltage drop variations within each circuit group in the arrangement in accordance with this embodiment (it may be considered that, although the drop of supply voltage in the case where no buffer circuit 74 is provided and that in the case of this embodiment are equal to each other, current variations, or variations in the output signal amplitude, are reduced and the drop of supply voltage equivalently becomes smaller in this embodiment).

As will be clear from FIG. 13, the provision of the buffer circuit 74 for each gate block 73 enables potential variations within the circuit group 75 to be further minimized practically.

Although the present invention has been described about the arrangement of power buses for compensating for variations in current among logic gates or variations in the output signal amplitude, objects which are to be compensated for are not necessarily limited thereto, and the arrangements of the power buses and the buffer circuit in accordance with the present invention may be applied to other objects of compensation.

For instance, in a circuit whose logic threshold value varies with fluctuations in the supply voltage, it may be considered to determine a logic threshold value by a certain control voltage and to compensate for supply voltage fluctuations with respect to the control voltage. One example of such circuit is mentioned in the specification of Japanese Patent Laid-Open No. 99819/1984 (corresponding to U.S. patent Ser. No. 555,618 filed on Nov. 28, 1983). This example of the circuit has a control voltage generator for compensating for the threshold voltage of an input circuit. The operation margin of this input circuit can be enlarged by applying the power bus arrangement in accordance with the present invention to the input circuit.

In the above-described embodiments, the configuration of the circuit group 14 or 75 is relatively close to a square as shown in FIG. 1 or 10, and the bias circuit 13 or 72 is disposed at the center thereof. However, it will be clear from the above description that circuit group 14 or 75 may be laterally or longitudinally elongated, and the bias circuit 13 or 72 is not always necessary to dispose at the center thereof.

In addition, it will also be clear from the foregoing description that the present invention offers great advantages when the degree of integration of the LSI so increases that it becomes a semiconductor device of wafer scale integration (WSI).

As has been described above, it is possible, according to the present invention, to minimize supply voltage variations among circuit groups within an integrated circuit, so that the operation margin of the circuit can advantageously increased.

What is claimed is:

1. A semiconductor device including a plurality of circuit groups each provided with a bias circuit having a supply voltage fluctuation compensating function, said semiconductor device comprising:
   a first power bus for feeding power to predetermined ones of said circuit groups; and second power buses respectively provided for said predetermined circuit groups such that each second power bus receives power from said first power bus and feeds the power to circuit elements in the corresponding circuit group, each of said second power buses being connected to said first power bus at a predetermined position to reduce variations in the supply voltage within each of said circuit groups.

2. A semiconductor device according to claim 1, wherein said first power bus and each of said second power buses are connected together at or near the center of the corresponding circuit group.

3. A semiconductor device according to claim 1, wherein said first and second power buses are provided through an insulating layer on a substrate on which said plurality of circuit groups are formed.

4. A semiconductor device according to claim 3, wherein said first and second power buses are provided in the same layer as each other.

5. A semiconductor device according to claim 3, wherein said first and second power buses are provided in separate layers.

6. A semiconductor device according to claim 5, wherein said second power buses are provided below said first power bus through an insulating layer and connected to said first power bus through through-holes provided in said insulating layer.

7. A semiconductor device according to claim 3, further comprising:
a plurality of third power buses provided on said substrate through an insulating layer and in a layer different from said first and second power buses, said third power buses extending in a direction perpendicular to a direction in which said first and second power buses extend, said second and third power buses being connected together through through-holes respectively provided at intersections between said second and third power buses, and said third power buses being respectively connected to desired circuit elements within said circuit groups.

8. A semiconductor device according to claim 1, wherein said first power bus is constituted by a bus having a predetermined width and extending in a predetermined direction, and each of said second power buses is constituted by a bus having a smaller width than that of said first power bus and extending in said predetermined direction in parallel with said first power bus.

9. A semiconductor device according to claim 1, wherein each of said second power buses is constituted by a bus whose width is reduced toward the peripheral portions of the corresponding circuit group, and said first power bus is constituted by a bus whose width is increased toward the peripheral portions of said circuit group.

10. A semiconductor device according to claim 1, wherein each of said circuit groups comprises said bias circuit and a plurality of circuit blocks each provided with a buffer circuit which receives an output from said bias circuit and generates a bias potential.

11. A semiconductor device according to claim 1, wherein each of said circuit groups comprises said bias circuit and a plurality of circuit blocks provided around said bias circuit, each of said circuit blocks being constituted by at least one gate.

12. A semiconductor device according to claim 11, wherein said gate is constituted by an emitter coupled logic, said first and second power buses serving as feeder lines for supplying a negative voltage source for said emitter coupled logic.

13. A semiconductor device according to claim 12, wherein each of said circuit blocks has a buffer circuit which receives an output from said bias circuit and generates a bias potential which is employed as a bias potential for a constant current source of said emitter coupled logic.

14. A semiconductor device comprising:
a plurality of circuit groups constituting an integrated circuit and each constituted by a plurality of circuit blocks and a bias circuit having a supply voltage fluctuation compensating function which applies a bias potential to said circuit blocks; and
a plurality of power buses provided above said circuit groups through an insulating layer so as to feed power to circuit elements in said circuit groups, at least one of said power buses being constituted by a first bus for feeding power to said circuit groups and a plurality of second buses respectively provided for said circuit groups so that each second bus receives power from said first bus and feeds the power to circuit elements in the corresponding circuit group, each of said second buses being connected to said first bus at a predetermined position on the corresponding circuit group at a predetermined position to reduce variations in the supply voltage within each of said circuit groups.

15. A semiconductor device according to claim 14, further comprising:
a plurality of third buses provided above said circuit groups through an insulating layer and in a layer different from said first and second buses, said third buses extending in a direction perpendicular to a direction in which said first and second buses extend, and said third buses being separated for each circuit group, and said second and third buses being connected together through through-holes respectively provided at intersections between said second and third buses, so that power is fed to circuit elements in each of said circuit groups through said third buses.

16. A semiconductor device according to claim 14, wherein said first and second buses are provided in the same layer as each other.

17. A semiconductor device according to claim 14, wherein said first and second buses are provided in respective layers through an insulating layer and connected together through through-holes provided in said insulating layer.

18. A semiconductor device according to claim 14, wherein each of said circuit blocks in each of said circuit groups has a buffer circuit which receives an output from said bias circuit in the corresponding circuit group and generates said bias potential.

19. A semiconductor device according to claim 18, wherein said buffer circuit is constituted by an emitter follower.

20. A semiconductor device according to claim 1, wherein each of said second power buses is connected to said first power bus at a single position on said second power bus.

21. A semiconductor device according to claim 14, wherein each of said second buses is connected to said first bus at a single position on said second power bus.

* * * * *